(12) United States Patent (10) Patent No.: US 8,519,432 B2
Barrow et al. (45) Date of Patent: Aug. 27, 2013

(54) SEMICONDUCTOR SWITCH

(75) Inventors: Jeffrey G. Barrow, Tucson, AZ (US);
Javier A. Salcedo, Lawrence, MA (US);
A. Paul Brokaw, Tucson, AZ (US)

(73) Assignee: Analog Devices, Inc., Norwood, MA (US)

( * ) Notice: Subject to any disclaimer, the term of this patent is extended or adjusted under 35 U.S.C. 154(b) by 1067 days.

(21) Appl. No.: 12/079,841

(22) Filed: Mar. 27, 2008

(65) Prior Publication Data

US 2008/0237630 A1 Oct. 2, 2008

Related U.S. Application Data

(60) Provisional application No. 60/920,491, filed on Mar. 27, 2007.

(51) Int. Cl.
*H01L 29/66* (2006.01)

(52) U.S. Cl.
USPC ........... 257/138; 257/122; 257/133; 257/137; 257/E27.032; 257/E29.221

(58) Field of Classification Search
USPC .................. 257/122, 138, E27.032, E29.221, 257/137, 133
See application file for complete search history.

(56) References Cited

U.S. PATENT DOCUMENTS 4,502,071 A * 2/1985 Herberg ......................... 257/133
6,118,141 A * 9/2000 Xu et al. ........................ 257/133

OTHER PUBLICATIONS

Silicon-Controlled Rectifier; Wikipedia; Feb. 12, 2007; [online]; Retrieved from the Internet: URL:http://en.wikipedia.org/wiki/Silicon-controlled_rectifier; 2 pp.

* cited by examiner

*Primary Examiner* — Hsin-Yi Hsieh
(74) *Attorney, Agent, or Firm* — Schwegman Lundberg & Woessner, P.A.

(57) ABSTRACT

A semiconductor switch comprises a PNPN structure arranged to provide an SCR-like functionality, and a MOS gate structure, preferably integrated on a common substrate. The switch includes ohmic contacts for the MOS gate, and for the cathode and gate regions of the PNPN structure; the anode contact is intrinsic. A fixed voltage is typically applied to an external node. The MOS gate structure allows current to be conducted between the external node and the intrinsic anode when on, and the PNPN structure conducts the current from the anode to the cathode when an appropriate voltage is applied to the gate contact. Regenerative feedback keeps the switch on once it begins to conduct. The MOS gate inhibits the flow of current between the external node and anode—and thereby turns off the switch—when off. When on, the MOS gate's channel resistance serves as a ballast resistor.

19 Claims, 8 Drawing Sheets

SECTION A-A

SECTION B-B

SECTION C-C

SECTION D-D

SECTION E-E

SEMICONDUCTOR SWITCH

RELATED APPLICATIONS

This application claims the benefit of provisional patent application No. 60/920,491 to Jeffrey G. Barrow and Javier A. Salcedo, filed Mar. 27, 2007.

BACKGROUND OF THE INVENTION

1. Field of the Invention

This invention relates generally to semiconductor switching devices, and more particularly to high current integrated switching devices.

2. Description of the Related Art

Many mixed-signal integrated circuit (IC) applications call for a device capable of switching high currents. One device which might be used for this purpose is a MOSFET. However, a MOSFET capable of handling the current to be switched is necessarily large, and may require an unacceptably large amount of area on an integrated circuit die.

Another device used for switching high currents is the silicon-controlled rectifier (SCR). One common SCR application is DC motor speed control, in which one or more SCRs are used to produce variable DC drive voltages from an AC line voltage. They are also used in lighting dimmer controls, and in phase control circuits used with inductive loads.

However, SCRs have a number of known shortcomings for integrated circuit applications. For example, parasitic capacitance within the device can cause it to be falsely triggered to turn on during fast voltage transients. For mixed-signal IC applications, on the other hand, the process design rules can make it difficult to form a reliable switch device which can be triggered at a desirable voltage level; in some cases, the triggering voltage may be too high for some circuit applications. Another limitation is that most SCRs require that the current passing from the anode to cathode terminal be reduced to near zero in order to be turned off. These drawbacks severely limit the types of applications in which a conventional SCR can be employed.

SUMMARY OF THE INVENTION

A semiconductor switch is presented which overcomes the problems noted above. The new switch provides a controllable means of being turned off that does not require the current through it to be zero, and is designed to inherently reduce the possibility of false triggering.

The present semiconductor switch comprises a PNPN structure arranged to provide an SCR-like functionality, and a MOS gate structure, preferably integrated on a common substrate. The present switch is typically connected between a fixed voltage and a load, where it is used to deliver a current to or conduct current from the load when on, and to block the flow of current to or from the load when off. Both 'high side' (cathode load connection) and 'low side' (anode load connection) versions are described. For a high side embodiment, the switch includes extrinsic contacts for the MOS gate, as well as to provide cathode and gate contacts for the PNPN structure; the anode contact is intrinsic. Another extrinsic contact provides an external node to which a fixed voltage would typically be applied. When an appropriate voltage is applied to the MOS gate structure, it causes a channel to be created which allows current to be conducted between the external node and the intrinsic anode when on, and the PNPN structure conducts the current from the intrinsic anode to the cathode when an appropriate voltage is applied to the gate contact. The switch structure is arranged such that regenerative feedback keeps the switch on once it begins to conduct. Changing the applied MOS gate voltage acts to deplete the channel and thus inhibit the flow of current between the external node and anode—and thereby turn off the switch.

The device is preferably fabricated as a planar device, with the PNPN and MOS structures being formed in the top surface of a common substrate. The PNPN structure preferably comprises parallel and adjacent stripe-shaped planar regions which are oriented such that they are parallel to a first axis, and the MOS structure is preferably oriented such that its gate region lies perpendicular to the first axis. When so arranged, the PNPN and MOS structures can be sized independently. The device can include a second PNPN structure located on the opposite side of the MOS structure from the first PNPN structure, such that the switch is symmetrical. The MOS structure is preferably arranged such that, when on, its channel resistance serves as a ballast resistor which limits the current conducted between the external node and the intrinsic anode, and thus by the switch.

The MOS structure preferably comprises a plurality of source, drain and gate regions which may be interconnected as needed to provide multiple functions. At least one source, drain and gate region may be arranged to form a MOSFET which, when on, serves as a shunt resistor between the external node and the SCR gate, and thereby provides a path for leakage current that might otherwise falsely trigger the PNPN structure to conduct.

The present switch is useful in many high current and high voltage switching circuit applications, and is well-suited for use in a circuit which provides controllable electrical overstress/electrostatic discharge (EOS/ESD) on-chip input/output protection. One specific circuit application is a level shifter circuit, in which a capacitive load is switched between two different voltages. High side and low side embodiments of the present switch are well-suited for charging and discharging the capacitive load.

These and other features, aspects, and advantages of the present invention will become better understood with reference to the following drawings, description, and claims.

BRIEF DESCRIPTION OF THE DRAWINGS

FIG. 4 is a simplified schematic diagram illustrating the operation of the switch shown in FIG. 3a.

DETAILED DESCRIPTION OF THE INVENTION

The present semiconductor switch comprises a semiconductor PNPN structure which provides an SCR-type of effect, in that regenerative feedback is used to keep the switch on once it begins to conduct, and a MOS gate structure which provides a means of turning off the switch, as well as providing other functions. This combination of structures provides a novel device which differs significantly from existing SCR and MOS devices. However, for ease of discussion, a portion of the device will be described below as an "SCR structure", with attendant anode, cathode and gate contacts, since it provides an SCR-like functionality. Note that this usage is not intended to limit the structure to that of a conventional SCR; this is only done to simplify the description.

The present switch is typically connected between a fixed voltage and a load, where it is used to deliver a current to or conduct current from the load when on, and to block the flow of current to or from the load when off. Both 'high side' and 'low side' switch embodiments are described: for a high side switch, the PNPN structure's anode connects to a series MOS gate structure and the PNPN cathode terminal typically connects to the load, and for a low side switch the PNPN structure's cathode connects to a series MOS gate structure while the anode typically connects to the load. For a high side embodiment, the switch includes ohmic contacts for the MOS gate, as well as for the cathode and gate contacts of the SCR-like PNPN structure, and another ohmic contact provides an 'external' node to which a fixed voltage would typically be applied; the anode contact is intrinsic. For the low side version, the switch includes ohmic contacts for the MOS gate and external node, as well as for the anode and gate contacts of the SCR-like PNPN structure; the cathode contact is intrinsic. The MOS gate structure—preferably a low voltage p-type MOSFET (LV PMOS) for a high side switch, or a low voltage n-type MOSFET LV NMOS for a low side switch—is arranged to control conduction. By applying a predetermined voltage, a channel is formed underneath the MOS gate to allow conduction of majority carriers—i.e., holes for a PMOS device and electrons for a NMOS device—between the external node and the intrinsic contact, while a different predetermined voltage can be applied to deplete the channel and inhibit current flow between the external node and intrinsic contact—and thereby turn the switch off.

A high side switch is further arranged to conduct current between the intrinsic contact and the cathode when a voltage greater than a threshold voltage is applied to the SCR structure's gate region, and to maintain the current conduction via regenerative feedback even when the voltage applied to the SCR's MOS gate region falls below the MOS threshold voltage.

Figure 1:
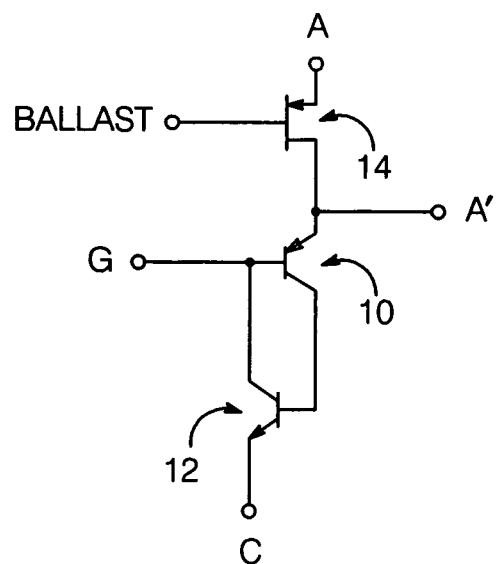
FIG. 1 is simplified schematic diagram illustrating the basic operation of the present semiconductor switch.

A simplified schematic which illustrates the basic operation of the present switch is shown in FIG. 1. A PNP transistor 10 and an NPN transistor 12 represent the PNPN SCR-like structure described above, with the emitter of the PNP transistor providing the SCR's anode, labeled in FIG. 1 as A', and the emitter of the NPN transistor providing the cathode C. The PNP's base and the NPN's collector provide the SCR's gate terminal G.

A MOS gate structure, preferably a PMOS FET 14 when used with a PNPN structure as shown in FIG. 1, is connected in series between A' and an external switch node labeled as A in FIG. 1. The drain of FET 14 is connected to anode A', its source is connected to external node A, and a control signal BALLAST is applied to its gate.

In operation, current conduction is switched on and off between external node A and cathode C. The device is switched on by pulling the signals applied to SCR gate terminal G and PMOS gate terminal BALLAST low. Pulling BALLAST low turns on FET 14, thereby connecting A to A'. Pulling G low causes the SCR to be triggered into conduction, and due to regenerative feedback, it continues to conduct even if G goes high—as long as the forward current through the device stays above a threshold value known as the "holding current". Alternatively, the SCR can be triggered into conduction by pulling the base voltage of its effective NPN transistor high with respect to the NPN emitter, but this is generally not a useful way of controlling the SCR. Having the forward current fall below the holding current causes the SCR—and thus the switch—to turn off.

However, the present switch provides another means of being turned off. This is done by bringing the BALLAST signal high, which turns off FET 14 and thereby reduces the feedback current through the SCR to turn it off. Thus, the present device also provides an external control means with which it can be turned off. Therefore, whereas conventional SCRs are generally employed only in AC switching applications, the present device may be used in both AC and DC switching applications.

FET 14 is preferably a low voltage MOSFET; for a high side switch, a low voltage p-type MOS (LV PMOS) structure as shown in FIG. 1 is used. The switch is designed such that, when on, most of the voltage across A and C is sustained across the PNPN blocking junction between structure terminals A' and C, with only a small voltage between A and A'. A LV PMOS designed to provide a high current density, but which is only subjected to a small voltage drop, can be made relatively small. When an LV PMOS is combined with an SCR structure as described herein, the overall size of the device required for a given current rating is much smaller than would be a necessary if a conventional HV CMOS transistor were used as the current switching device. For example, an HV CMOS device capable of switching a given current might require a gate oxide thickness of 300 Å and a minimum gate length of 7 μm, whereas an LV PMOS capable of conducting the same current to the SCR anode terminal A' might require a gate oxide thickness of only 75 Å and a minimum gate length as low as 0.4 μm.

Figure 2:
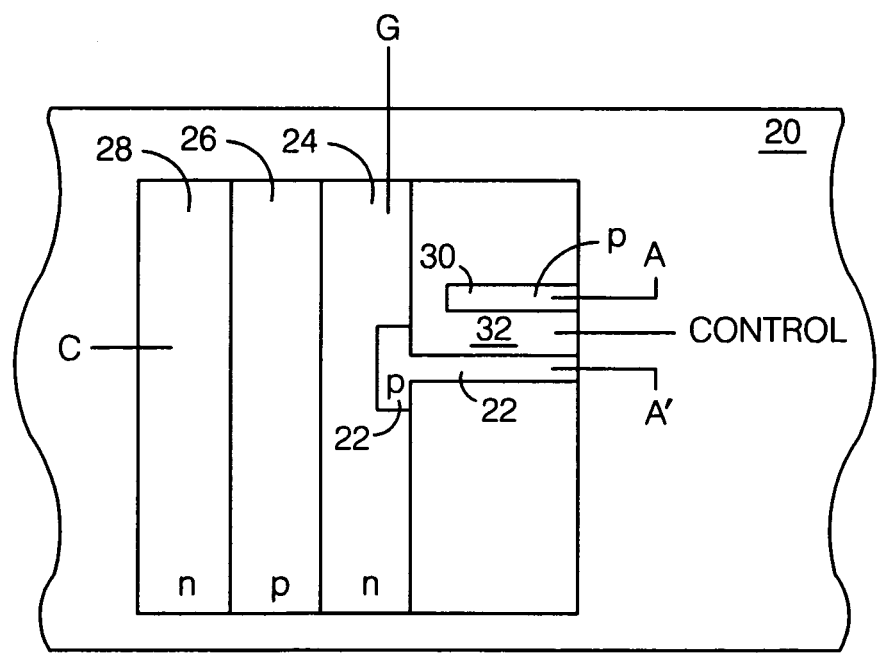
FIG. 2 is a simplified plan view of one possible embodiment of a semiconductor switch in accordance with the present invention.

FIG. 2 is a plan view of one possible embodiment of a semiconductor switch in accordance with the present invention. The exemplary embodiment in FIG. 2 comprises a PMOS FET and a PNPN SCR structure; however, a complementary polarity device featuring an NMOS FET and a PNPN SCR structure is also contemplated, and is discussed below. Note that the diagram of FIG. 2 is simplified for purposes of illustration. Metallization is not shown for clarity.

The PNPN structure preferably comprises parallel and adjacent stripe-shaped planar regions formed in the top surface of a substrate 20. The PNPN structure includes a first p-type planar region 22, a first n-type planar region 24 formed laterally adjacent to p-type region 22, a second p-type planar region 26 formed laterally adjacent to n-type region 24, and a second n-type planar region 28 formed laterally adjacent to p-type region 26. Regions 22, 24 and 26 form the SCR structure's effective PNP transistor, and regions 24, 26 and 28 form its effective NPN transistor. Ohmic contacts to n-type region 28 and n-type region 24 provide the SCR structure's cathode (C) and gate (G) terminals, respectively. The contact to the SCR structure's anode region A' (22) is intrinsic.

The PMOS FET structure is also preferably a planar device, formed in the top surface of substrate 20. In this simplified view, the PMOS includes a p-type source region 30, first p-type region 22 serving as a drain region, and a gate region 32 which would typically comprise polysilicon. An ohmic contact to source region 30 provides the device's external node terminal A, drain region 22 is the device's anode A' as noted above, and an ohmic contact to gate region 32 provides the device's BALLAST terminal.

In operation, current conduction is switched on and off between external node A and cathode C. When the current is to be conducted from node A to cathode C, the signals applied to the SCR gate terminal (G) and the PMOS gate (BALLAST) are pulled low. This turns on the PMOS and SCR structures, thereby allowing the applied current to flow from external node A to anode A', and then through the SCR structure to cathode C. Regenerative feedback keeps the switch on once it begins to conduct, even if the signal applied to gate terminal G goes high, as long as current conduction is greater than the holding current. Making the BALLAST signal high turns off the PMOS device, thereby inhibiting the flow of current between external node A and anode A' and turning the device off.

The MOSFET and the SCR structure are preferably oriented as shown in FIG. 2; i.e., with the PNPN structure (24, 26, 28 and a portion of first p-type planar region 22) arranged as parallel stripe-shaped regions oriented such that they are parallel to a first axis, and with the MOSFET oriented such that its gate region 32 lies perpendicular to the first axis. This arrangement enables the SCR and MOSFET structures to be sized independently. To provide a high current density rating, the MOSFET requires a low channel resistance, which is obtained by having a large width/length ratio. When oriented as shown in FIG. 2, the width of the MOSFET can be sized as needed without impacting the dimensions of the SCR structure's regions.

Figure 3A:
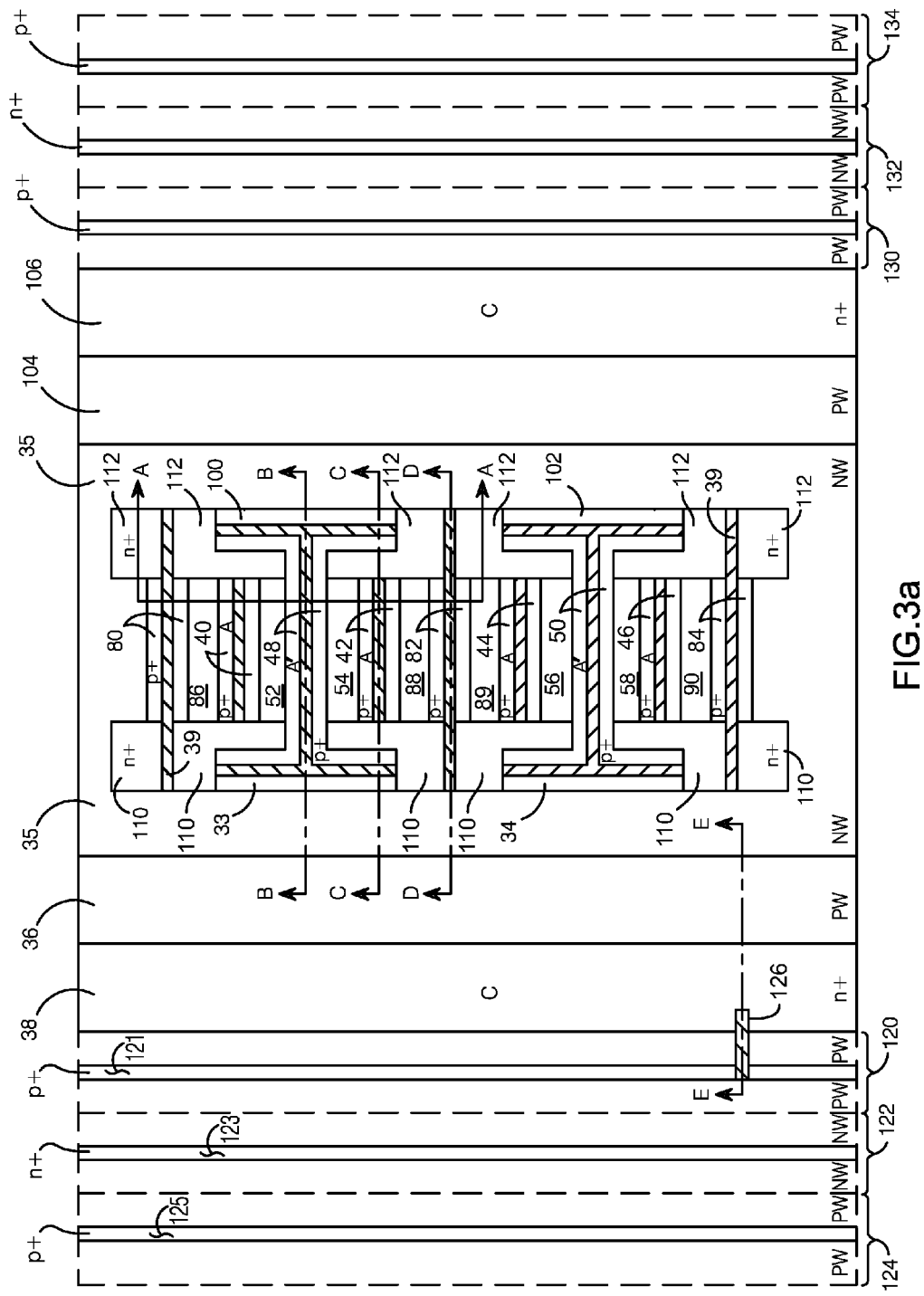
FIG. 3a is a plan view of one possible embodiment of a 'high side' semiconductor switch in accordance with the present invention.

FIG. 3a is a plan view of another possible embodiment of a semiconductor switch in accordance with the present invention, which again comprises a PMOS FET and a PNPN SCR structure. Here, the PNPN structure includes p+ planar regions 33 and 34, n-well (NW) planar region 35, p-well (PW) planar region 36, and n+ planar region 38 formed on a common substrate. Regions 33/34, 35 and 36 form the SCR structure's effective PNP transistor, and regions 35, 36 and 38 form its effective NPN transistor. Ohmic contacts to n-type region 38 and p-type regions 33 and 34 provide the SCR structure's cathode (C) (metallization not shown) and anode (A') terminals, respectively. The SCR structure's gate connection for this embodiment will be discussed below. Note that as used herein, an 'n+' material or region refers to an n-type region to which additional donor atoms have been added, such that an n+ region is more highly doped than an n-type region. Similarly, a 'p+' material or region refers to a p-type region to which additional acceptor atoms have been added, such that an n+ region is more highly doped than an n-type region.

The PMOS FET structure is also a planar device formed in the top surface of the substrate. Here, however, the PMOS comprises a plurality of source, drain and gate regions, which may be interconnected as needed to provide multiple functions.

The PMOS gate regions are preferably polysilicon, and its source and drain regions are preferably p+ material. Metallization 39 providing contacts to the source and drain regions is shown in FIG. 3a; metallization to the PMOS gate regions is not shown for clarity in FIG. 3a, but is shown in FIGs. 3b-3e discussed below.

At least one source, one drain and one gate region are arranged to form a PMOS FET which conducts a current between an external node (A) and anode A' when on, and inhibits the flow of current between A and A' and thereby turns off the device when off. In FIG. 3a, external node A comprises four p+ regions 40, 42, 44 and 46 connected together (interconnection not shown), anode A' comprises a p+ region 48 which is contiguous with region 33 and p+ region 50 which is contiguous with region 34, and gate regions 52, 54, 56 and 58 are located between respective pairs of adjacent A and A' regions.

Figure 3B:
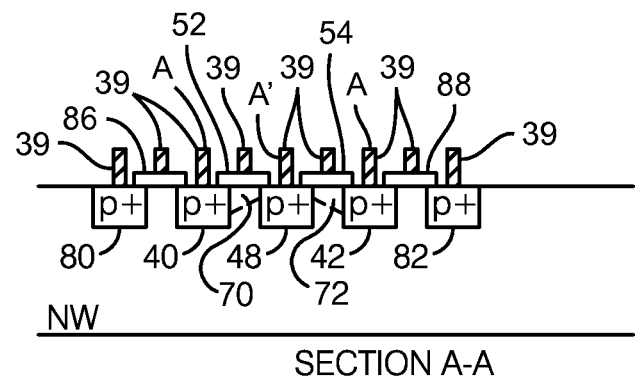
FIG. 3b is a cross-sectional view of the switch shown in FIG. 3a, cut along section line A-A.

A cross-sectional view of the PMOS structure of FIG. 3a cut along section line A-A is shown in FIG. 3b. When an appropriate voltage is applied to gate region 52, a channel 70 is formed between node A 40 and the intrinsic anode contact A' 48. Similarly, applying a voltage to gate region 54 creates a channel 72 between external node A 42 and intrinsic anode contact A' 48. The gate voltages would typically be applied to both regions 52 and 54 simultaneously.

In addition to providing conductive paths between external nodes A and intrinsic anode A', channels 70 and 72 provide an additional function. The channels have an inherent channel resistance. This channel resistance serves as a ballast resistor which limits the current conducted between external nodes A and anode A', and thus by the semiconductor switch. For this reason, gate regions 52 and 54 form the switch's BALLAST terminal.

The MOS structure preferably also includes one or more additional p+ regions; three such regions 80, 82 and 84 are shown in FIG. 3a, and regions 80 and 82 are shown in FIG. 3b. The metallization on these regions extends to NW region 35, thereby providing a contact to the SCR structure's gate region (the base region of the SCR structure's effective PNP transistor).

By locating p+ regions 80, 82 and 84 where shown, MOSFETs are created with the adjacent external node regions as follows: highly doped region 80 with highly doped A region 40 separated by a MOS gate region 86, highly doped region 82 with highly doped A region 42 separated by a MOS gate region 88 and with highly doped A region 44 separater by a MOS gate region 89, and highly doped region 84 with highly doped A region 46 separated by a MOS gate region 90. When so arranged, when an appropriate voltage is applied to PMOS gate region 86, a channel is created between A region 40 and region 80 and thereby SCR gate region 35. Similarly, when a voltage is applied to PMOS gate region 88, a channel is created between A region 42 and region 82 and thereby SCR gate region 35. The gate voltages would typically be applied to both regions 86 and 88 simultaneously. This voltage would be applied when the switch is to be turned off. With the voltage applied and the channels created, the emitter-base junctions of the SCR structure's effective PNP transistors are effectively shunted together, encouraging turn-off. These channels also provide a path for leakage current that might otherwise falsely trigger the SCR structure device to conduct, thereby improving the device's i=C*dV/dt immunity; its blocking voltage is also improved. When the gate voltage is not applied and these channels are not present, regions 80, 82 and 84 act as parasitic collectors for stray minority carriers.

In one possible alternative embodiment, regions 36, 38, 104 and 106 are highly-doped, and are enclosed by a separate, deeper PW region (not shown). When so arranged, the SCR structure's main blocking junction is formed between the deeper PW region and NW region 35. The present switch might also be fabricated to include an n-type buried layer (NBL) (not shown) beneath the switch regions illustrated in FIG. 3a, which acts to electrically isolate the switch from the common substrate.

This 'shunt' channel is created by applying an appropriate voltage to PMOS gate regions 86 and 88; as such, these gate regions form the device's SHUNT terminal; this is illustrated schematically in FIG. 4, discussed below. The signals applied to the BALLAST and SHUNT terminals would typically be opposite phase signals, since the MOSFET controlled by BALLAST is turned on when the switch is to be turned on (while SHUNT holds the shunt MOSFET off), and the MOSFET controlled by SHUNT is turned on when the device is to be turned off (while BALLAST holds the ballast MOSFET off).

Thus, the present semiconductor switch provides basic current switching functionality, as well as all the additional shunt and ballast functions described above, by virtue of the novel structure described above. A circuit comprising a set of discrete components roughly equivalent to those formed by the novel structure would not be able to provide the same level of performance and control flexibility as the present switch, even if fabricated on a common substrate.

The present switch is preferably a symmetrical device. As shown in FIG. 3a, the MOS structure is preferably symmetrical about a centerline, and the switch preferably includes a second PNPN SCR structure on the opposite side of the MOS structure. The second PNPN structure comprises p+ regions 100 and 102, which are contiguous with p+ regions 48 and 50, respectively, NW-region 35, a P-well region 104 and an n+ region 106. This arrangement ensures symmetrical current flow, and serves to eliminate parasitic collector action and improves area usage. The symmetry also ensures that the voltage gradient across NW region 35 is held to 0 volts, and that all minority current flows to the sides.

The shapes of the A and A' regions are preferably as shown in FIG. 3a, with the A' regions (48, 50) including a contiguous portion (33, 34) which is oriented parallel to stripe-shaped regions 35, 36 and 38. In contrast, the A regions (40, 42, 44, 46) preferably do not include a contiguous parallel portion, and terminate at a portion 110 of NW region 35 which is preferably doped n+ (discussed below). This arrangement enables the A' regions to have a much larger interface area with NW region 35 than the A regions have with n+ region 110. Both the A' and A regions form effective PNP transistors with the other device regions. However, the larger interface area of the A' regions enables their effective PNP transistors to have a much higher beta value than those formed with the much smaller interface area of the A regions. When the switch is supposed to be off, there is ideally no conduction from either the A or A' regions to NW region 35. There will not be conduction from the A' region, since the PMOS which connects A to A' will be off. But conduction is still possible from the A regions even with the PMOS off, since a current is still applied to the A regions. However, the very small interface area and resulting small beta value make the A regions poor injectors.

The beta value of the effective PNP transistors formed with the A regions is further reduced by having A regions 40, 42, 44 and 46 terminate at highly-doped n+ portion 110. N+ portion 110 tends to further depress the beta value of the effective PNP transistors formed with the A regions.

As noted above, the present switch is preferably symmetrical. As such, contiguous p+ regions 100 and 102 of A' regions 48 and 50 are preferably oriented parallel to stripe-shaped regions 35, 36 and 38, such that the A' regions are I-shaped. The symmetrical device also preferably includes a portion 112 of NW region 35 which is preferably doped n+, located on the opposite side of the PMOS structure from n+ region 110. The A regions 40, 42, 44 and 46 then preferably terminate at n+ region 110 at one end, and at n+ region 112 at the other end.

Figure 3C:
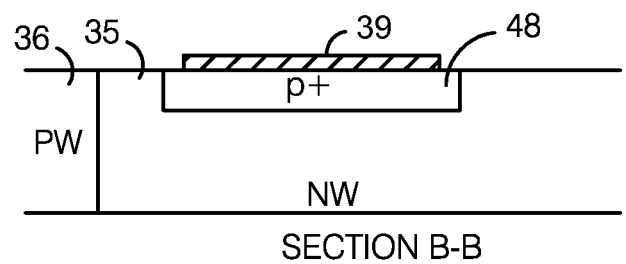
FIG. 3c is a cross-sectional view of the switch shown in FIG. 3a, cut along section line B-B.
Figure 3D:
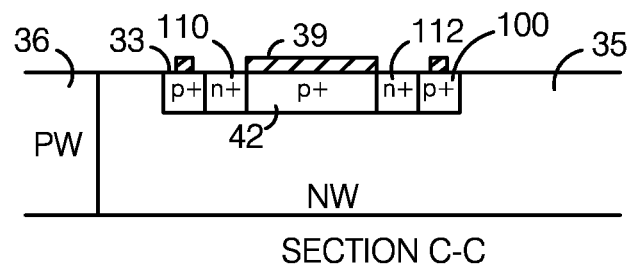
FIG. 3d is a cross-sectional view of the switch shown in FIG. 3a, cut along section line C-C.
Figure 3E:
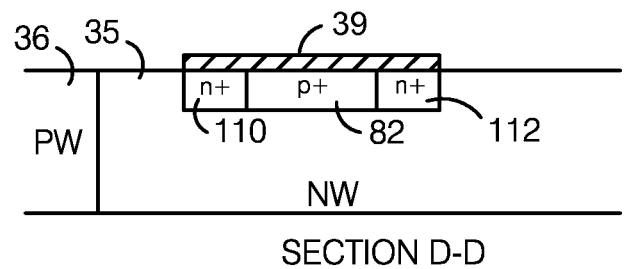
FIG. 3e is a cross-sectional view of the switch shown in FIG. 3a, cut along section line D-D.

Additional cross-sectional views of the PMOS structure of FIG. 3a are shown in FIGS. 3c, 3d and 3e. FIG. 3c, cut along section line B-B, shows A' region 48 and its metallization 39. FIG. 3d, cut along section line C-C, shows A region 42 and its metallization 39, n+ regions 110 and 112, and portions of A' regions 33 and 100. FIG. 3e, cut along section line D-D, shows p+ region 82 and its metallization 39, and n+ regions 110 and 112.

Referring again to FIG. 3a, a semiconductor switch in accordance with the present invention may include additional regions 120, 122 and 124 beyond the n+ cathode region 38. Region 120 is preferably a PW region which includes a p+ stripe 121; metallization (represented in FIG. 3a as a narrow stripe 126) preferably connects p+ stripe 121 to n+ cathode region 38. To maintain the symmetry of the device, additional regions 130, 132 and 134 lie beyond the n+ cathode region 106. Regions 130, 132 and 134 are equivalent to regions 120, 122 and 124. However, for simplicity, only regions 120, 122 and 124 are described below.

Region 122 is preferably an NW region which includes an n+ stripe 123. Metallization (not shown) preferably connects n+ stripe 123 to the SCR structure's gate region 35. When so arranged, region 122 acts to collect parasitic minority carriers from the emitter of the SCR structure's effective NPN transistor (region 38). Region 124 is preferably a PW region which includes a p+ stripe 125, and serves as a substrate contact.

Figure 3F:
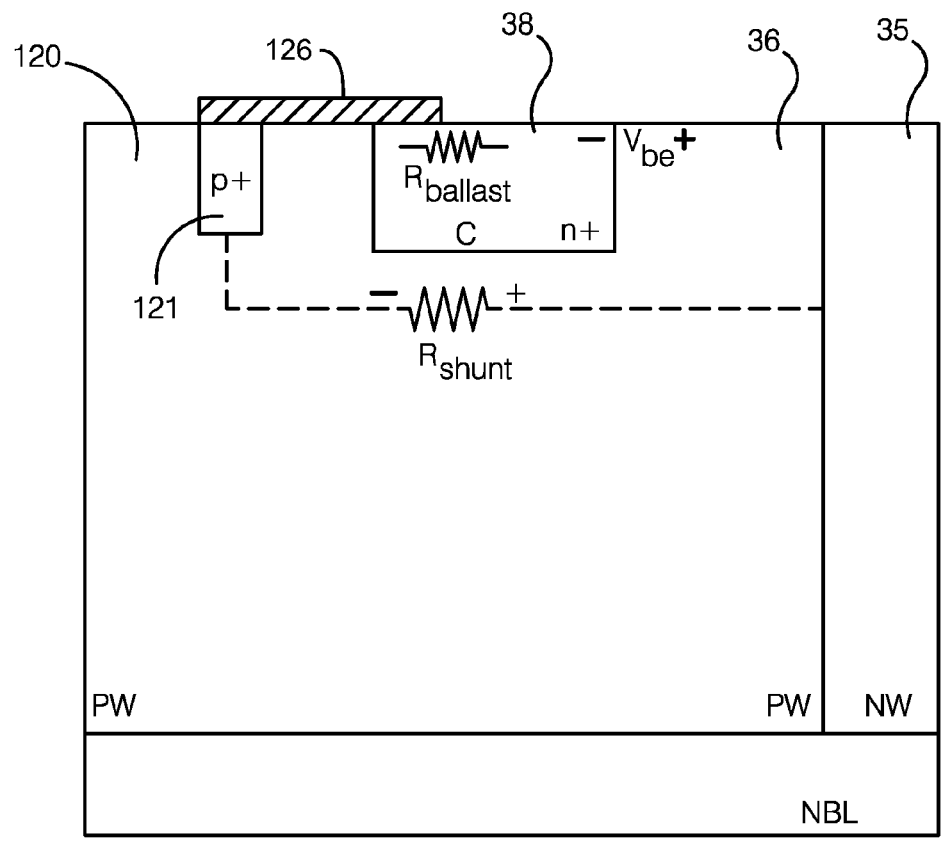
FIG. 3f is a cross-sectional view of the switch shown in FIG. 3a, cut along section line E-E.

A cross-sectional view of regions 35, 36, 38 and 120 is shown in FIG. 3f, cut along section line E-E. Majority current between NW region 35 and p+ region 121 of PW region 120 generate a voltage gradient that opposes unwanted minority current flow. In addition, the PW region between NW region 35 and p+ region 121 acts as an internal base-emitter shunt resistor for majority carriers; this passive resistor is referred to herein as $R_{shunt}$. Thus, this region provides a safe path for leakage current, as well as for i=C*dV/dt current.

The diffusion area for cathode 38 is preferably stretched so as to increase the current path for majority carriers and $R_{shunt}$. Majority current through the PW region develops a base-emitter voltage ($V_{be}$) at the interface between regions 38 and 36, which acts to forward-bias the emitter-base junction and turn on the SCR structure. When the n+ cathode region 38 is arranged as shown in FIGS. 3a and 3f, it also functions as a passive ballast resistor—referred to herein as $R_{ballast}$—for the emitter of the SCR structure's effective NPN transistor.

Figure 4:
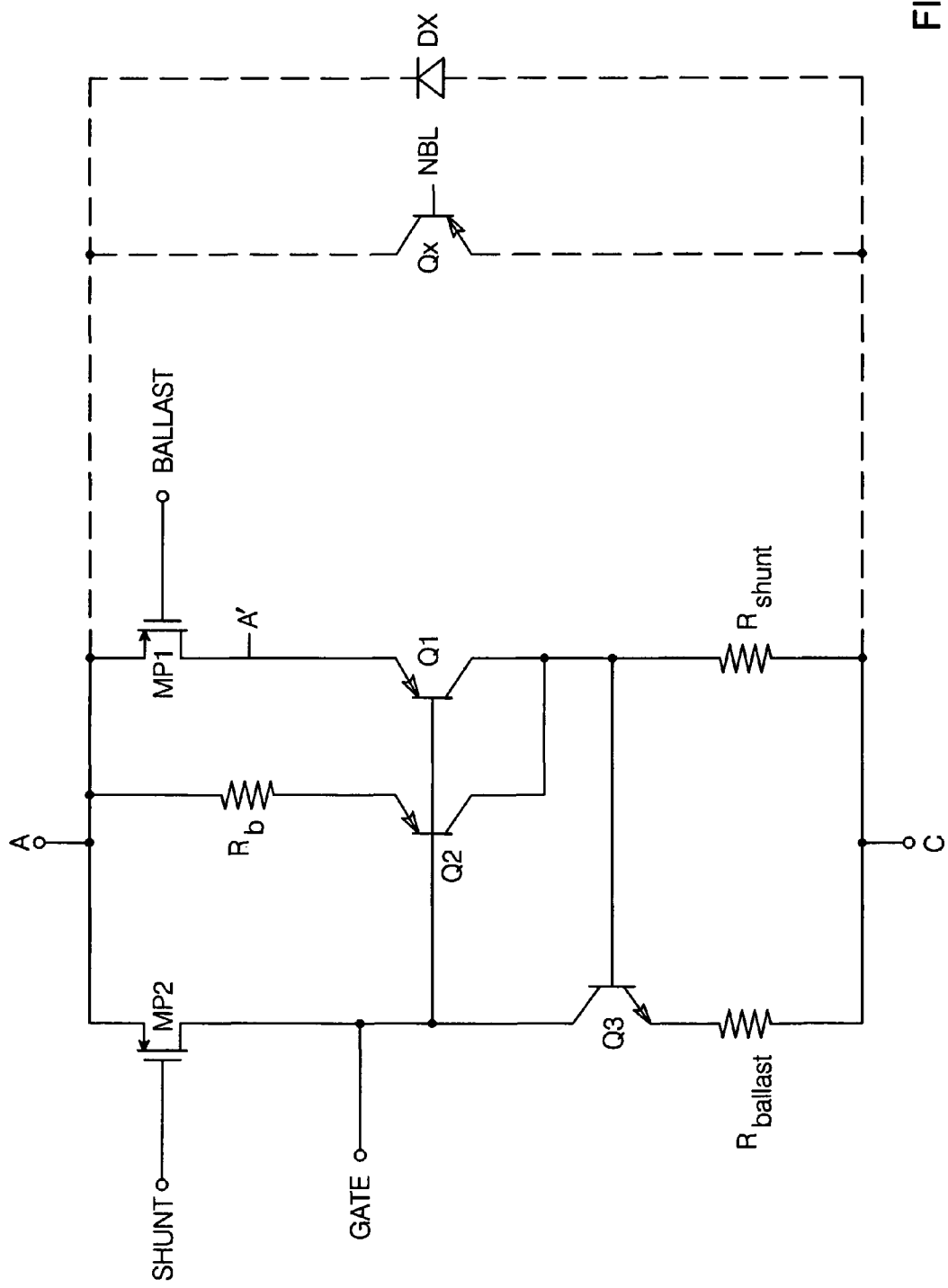

A simplified schematic diagram which provides an approximation of how a high side semiconductor switch per the present invention functions is shown in FIG. 4. Each component and the functions it provides are discussed below:

the PMOS transistor which connects external node A to intrinsic anode A' when on is identified in FIG. 4 as MP1; as noted above, this FET is controlled with signal BALLAST. When on, MP1 provides a majority carrier path from A to A', and adds a series emitter ballast resistance. When off, MP1 blocks current flow to intrinsic anode A'.

the PMOS transistor which connects external node A to the SCR structure's gate G when on is identified as MP2, and is controlled with signal SHUNT. MP2 is an active base-emitter shunt device. When on, MP2 improves i=C*dV/dt immunity, encourages SCR structure shut-off, and improves blocking voltage. When it is off, MP2 acts as a parasitic collector for stray minority carriers. As noted above, BALLAST and SHUNT would typically be opposite phase signals.

a resistor $R_b$ represents an integrated base resistance, which serves to limit injection from external node A, as well as ESD surge current.

Q1 is the SCR structure's effective PNP transistor and internal anode injector A'.

Q2 is a parasitic PNP which also serves as an anode injector, and is beneficial when the device is subjected to electrostatic discharge (ESD).

Q3 is the SCR structure's effective NPN transistor and the primary cathode injector.

$R_{ballast}$ is the passive, emitter ballast resistance described above.

$R_{shunt}$ is the emitter-base shunt resistance described above, which improves i=C*dV/dt immunity, encourages SCR structure shut-off, and improves blocking voltage. $R_{shunt}$ also sets up an electric field that opposes unwanted minority carrier flow.

As noted above, when the switch is on, MP1 is on and MP2 is off, and when the switch is off, MP1 is off and MP2 is on.

The present structure may give rise to an intrinsic reverse parasitic PNP transistor Qx, with PW regions 36 and 104 providing the emitter of Qx, NW region 35, n+ regions 110 and 112, and the NBL region described above (if present) forming the base, and A regions 40, 42, 44 and 46 forming the collector. Unfortunately, this intrinsic reverse parasitic PNP transistor, after reaching its open-base breakdown voltage, does not provide adequate discharging capability to sustain a high level of stress. However, a reverse conduction path may be provided by diodes Dx, formed by PW region 120 and NW region 122, and by PW region 130 and NW region 132. When PW regions 120 and 130 are electrically connected to cathode regions 38 and 106, and NW regions 122 and 132 are electrically connected to anode regions 40, 42, 44, 46, diodes Dx are connected in parallel with Qx. As such, diodes Dx provide a reverse conduction path which acts to prevent break down of intrinsic transistor Qx, and to discharge high stress EOS/ESD current in the C-A path. The forward and reverse conduction paths may be de-coupled by forming symmetric NW implants within PW regions 36 and 104. Note that a reverse conduction path could alternatively be provided with a discrete diode connected in parallel with Qx.

Figure 5:
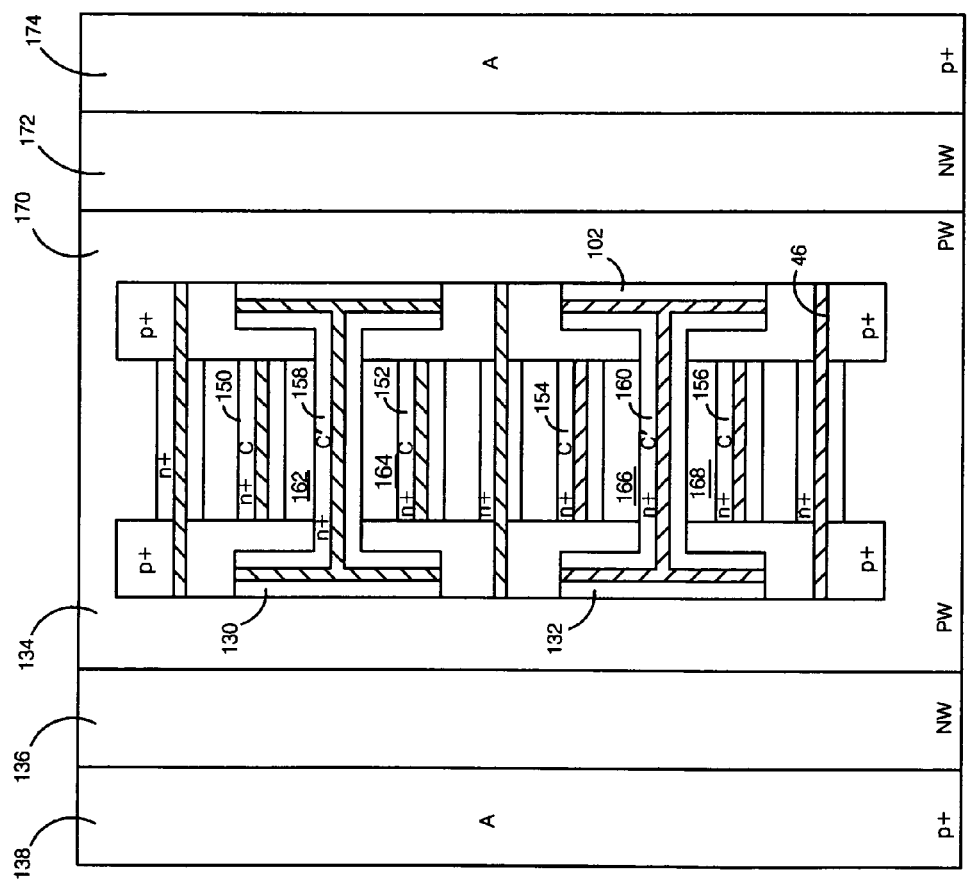
FIG. 5 is a plan view of one possible embodiment of a 'low side' semiconductor switch in accordance with the present invention.

FIG. 5 is a plan view of one possible embodiment of a 'low side' complementary semiconductor switch in accordance with the present invention, which preferably comprises a NMOS FET and a PNPN SCR structure. The PNPN structure includes n+ planar regions 130 and 132, a PW planar region 134, a NW planar region 136, and a p+ planar region 138 formed on a common substrate. Regions 130/132, 134 and 136 form the SCR structure's effective NPN transistor, and regions 134, 136 and 138 form its effective PNP transistor. Ohmic contacts to p-type region 138 and n-type regions 130 and 132 provide the SCR structure's anode (A) (metallization not shown) and intrinsic cathode (C') terminals, respectively.

The NMOS structure comprises n+ source and drain regions. Metallization 146 providing contacts to the source and drain regions is shown in FIG. 5; however, metallization to the NMOS gate regions is not shown for clarity. At least one source, drain and gate region are arranged to form a NMOS FET which conducts a current between an external node (C) and intrinsic cathode C' when on, and inhibits the flow of current between C and C' and thereby turns off the switch when off. In FIG. 5, external node C comprises four n+ regions 150, 152, 154 and 156 connected together (interconnection not shown), cathode C' comprises a n+ region 158 which is contiguous with region 130, n+ region 160 which is contiguous with region 132, and gate regions 162, 164, 166 and 168 are located between respective pairs of adjacent C and C' regions.

The low side switch operates in a similar fashion as the high side switch described above, except that the polarities of the control signals are reversed. For example, when an appropriate voltage is applied to gate regions 162 and 164, channels are formed which connect external nodes C 150 and 152 to intrinsic cathode C' 158.

As with the high side embodiment shown in FIG. 3a, the low side embodiment is preferably a symmetrical device, with I-shaped C' regions and PW (170), NW (172) and p+ (174) regions on the opposite side of the NMOS structure. In addition, the low side embodiment preferably includes additional regions (not shown) beyond anode regions 138 and 174 which are the opposite polarity equivalents of regions 120, 122, 124, 130, 132 and 134 shown in FIG. 3a. The low side device provides the same functionality as did the high side version, with the NMOS structure providing active ballast and shunt resistance functions, and other regions providing beneficial passive ballast and shunt resistances as described above.

Figure 6:
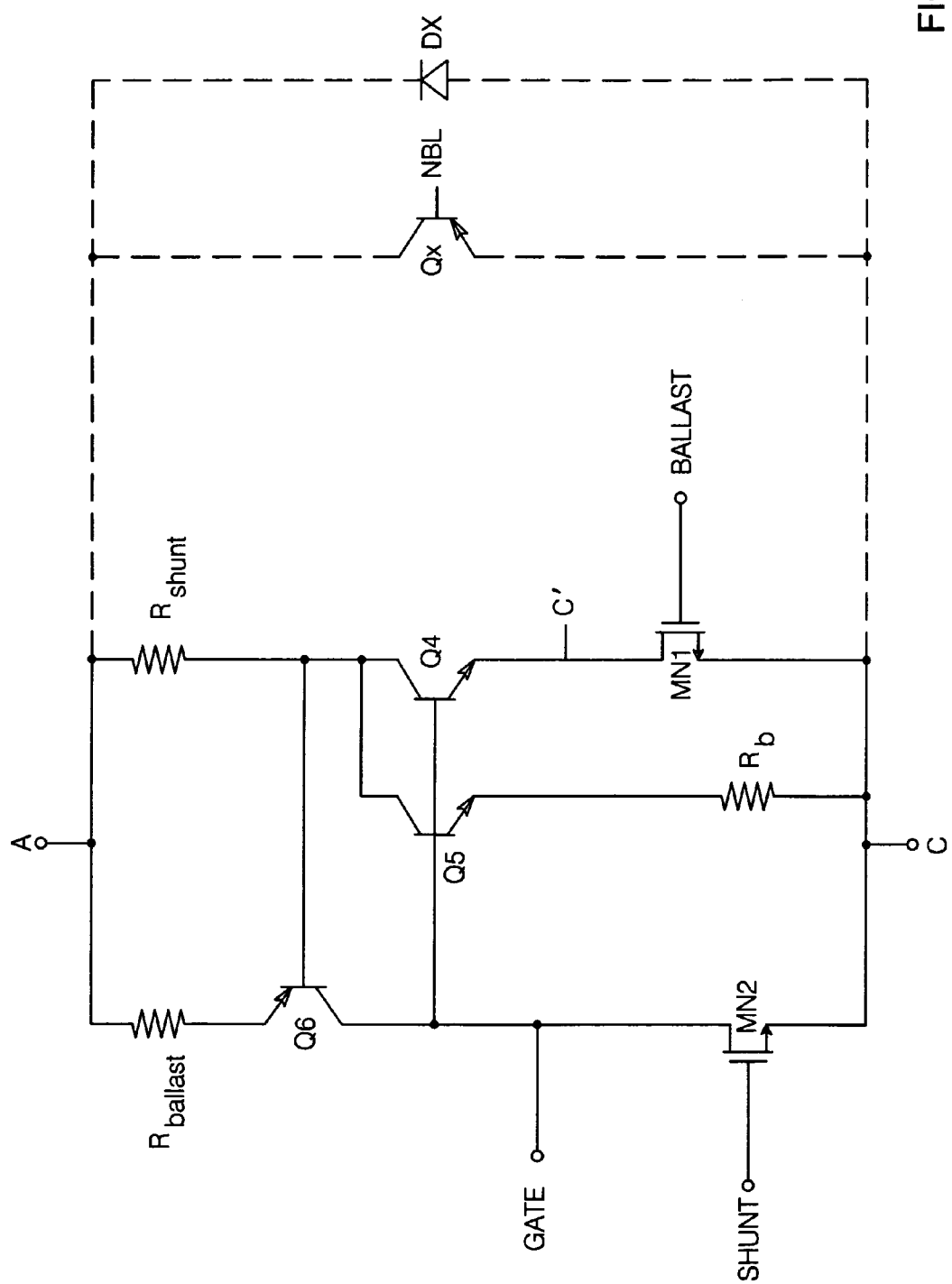
FIG. 6 is a simplified schematic diagram illustrating the operation of the switch shown in FIG. 5.

A simplified schematic diagram which provides an approximation of how a low side semiconductor switch per the present invention performs is shown in FIG. 6. The components provide the same functions as their counterparts in FIG. 4.

the NMOS transistor which connects external node C to intrinsic cathode C' when on is identified in FIG. 6 as MN1, and is controlled with the BALLAST signal. When on, MN1 provides a majority carrier path from C to C', and adds a series emitter ballast resistance. When off, MN1 blocks current flow to intrinsic cathode C'.

the NMOS transistor which connects external node C to the SCR structure's gate G when on is identified as MN2, and is controlled with signal SHUNT. MN2 is an active base-emitter shunt device, which improves i=C*dV/dt immunity, encourages SCR structure shut-off, and improves blocking voltage when on. When off, MN2 acts as a parasitic collector for stray minority carriers.

resistor $R_b$ functions as described above.

Q4 is the SCR structure's effective NPN transistor and internal cathode injector C'.

Q5 is a parasitic NPN which also serves as a cathode injector, and is beneficial when the device is subjected to electrostatic discharge (ESD).

Q6 is the SCR structure's effective PNP transistor and the primary anode injector.

$R_{ballast}$ and $R_{shunt}$ are as described above.

Here, when the switch is on, MN1 is on and MN2 is off, and when the switch is off, MN1 is off and MN2 is on.

As was the case for the high side switch discussed above, the low side structure may give rise to an undesirable intrinsic reverse parasitic PNP transistor Qx which, after reaching its open-base breakdown voltage, does not provide adequate discharging capability to sustain a high level of stress. However, a reverse conduction path may be provided by diodes Dx which are connected in parallel with Qx. As above, diodes Dx provide a reverse conduction path which acts to prevent break down of intrinsic transistor Qx, and to discharge high stress EOS/ESD current in the C-A path. The forward and reverse conduction paths may be de-coupled by forming symmetric PW implants within NW regions 136 and 172. As above, a reverse conduction path could alternatively be provided with a discrete diode connected in parallel with Qx.

Figure 7:
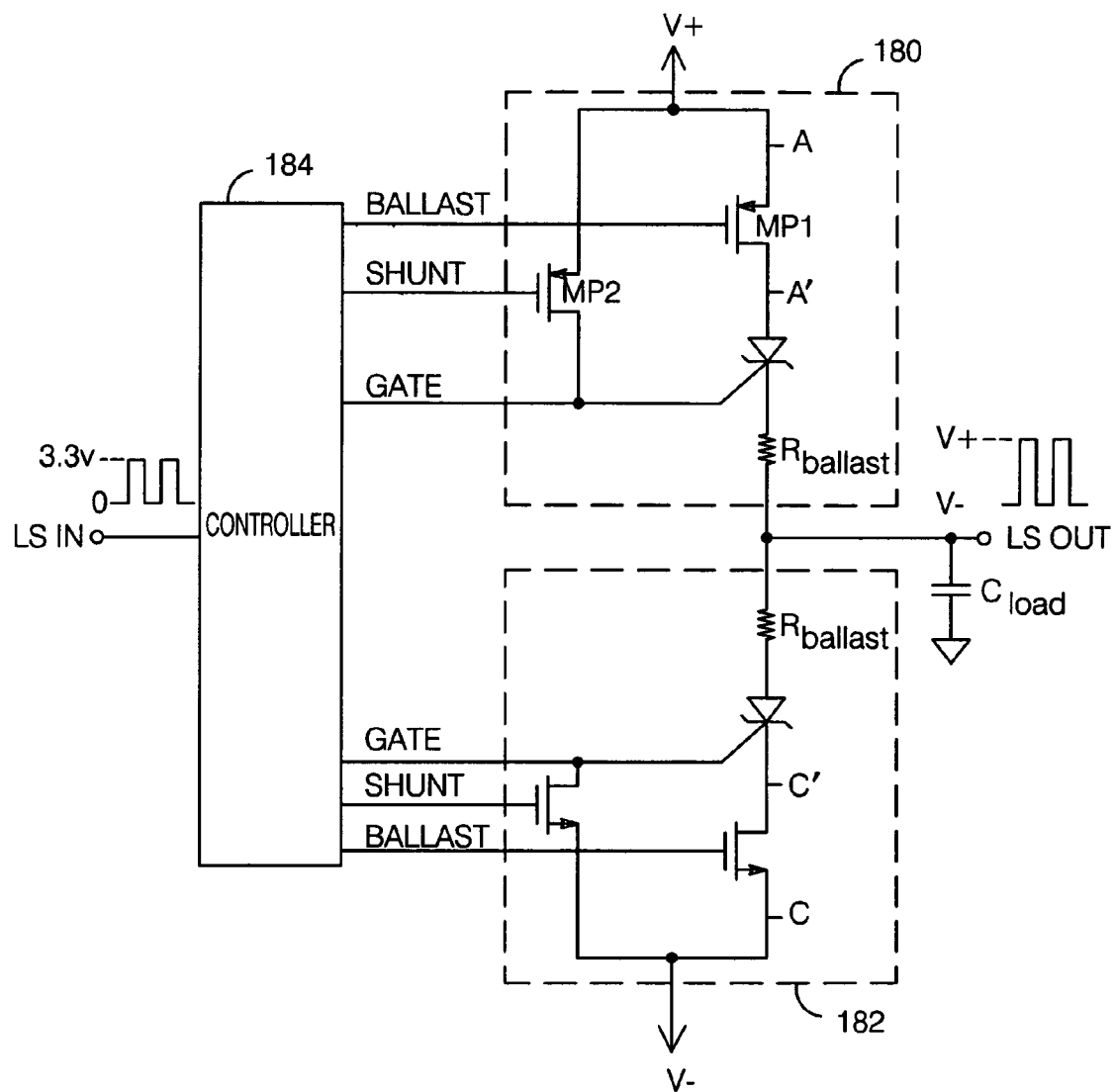
FIG. 7 is a simplified schematic diagram illustrating an application of the present switch in a level shifting circuit.

One possible use for the present semiconductor switch is a level shifter application, in which the voltage across a capacitive load must be switched, between two voltages. Such an application is illustrated in FIG. 7. A high side semiconductor switch 180 in accordance with the present invention is connected between a first supply voltage (V+) and the level shifter circuit's output (LS OUT), and a low side semiconductor switch 182 is connected between LS OUT and a second supply voltage (V−). Note that the circuitry shown for semiconductor switches 180 and 182 is highly simplified. A controller 184 provides the BALLAST, SHUNT and GATE control signals needed to operate the two switches. The controller would typically be driven with a logic level control signal provided at an input (LS IN), and would operate switches 180 and 182 as needed to provide an output at LS OUT which toggles between ~V+ and ~V− in response to LS IN. Assuming that LS OUT drives a large capacitive load $C_{load}$, a large current must be conducted to $C_{load}$ via switch 180 when LS OUT toggles high, and a large current must be conducted from $C_{load}$ via switch 182 when LS OUT toggles low. A high current switching device such as the semiconductor switch described herein is well-suited for this task. For example, a lever shifter as described above could be used to replace driver circuitry conventionally used to drive a row in an array of LCD pixels.

The present switch can also be used to provide controllable electrical overstress/electrostatic discharge (EOS/ESD) on-chip protection for one or more circuit nodes or I/O pins. For example, switches 180 and 182 in FIG. 7 could be used to provide ESD protection for the LS OUT node. By triggering the appropriate switch to turn on during an EOS/ESD condition, a discharge path is provided that protects the node.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

We claim:

1. A semiconductor switch, comprising:
   a substrate;
   a first PNPN structure on said substrate;
   electrical contacts which provide anode, gate and cathode connections to said first PNPN structure;
   an external node; and
   a MOSFET on said substrate arranged to conduct a current between said external node and said electrical contact which provides said anode connection when on and to inhibit the current conducted between said external node and said electrical contact which provides said anode connection and thereby turn off said semiconductor switch when off,
   said first PNPN structure arranged to conduct a current between said electrical contact which provides said anode connection and said electrical contact which provides said cathode connection when a voltage lower than a threshold voltage is applied to said electrical contact which provides said gate connection to said first PNPN structure, and to maintain said current conduction via regenerative feedback when the voltage applied to said electrical contact which provides said gate connection to said first PNPN structure rises above said threshold voltage as long as said current conducted between said electrical contact which provides said anode connection and said electrical contact which provides said cathode connection is greater than a threshold current;
   wherein said first PNPN structure comprises parallel and adjacent stripe-shaped n-type and p-type planar regions formed in the top surface of said substrate, and
   wherein said MOSFET is a planar structure formed in the top surface of said substrate adjacent to said first PNPN structure and comprising parallel and adjacent stripe-shaped source, gate and drain planar regions,
   with the gate regions spaced apart from each other, such that, when the top surface of said substrate is viewed from above in a plan view, said first PNPN structure's parallel and adjacent stripe-shaped planar regions are oriented such that they are extended parallel to a first axis and said MOSFET is oriented such that said MOSFET's parallel and adjacent stripe-shaped source, gate and drain planar regions are extended perpendicular to said first axis, such that said first PNPN structure and said MOSFET structure can be sized independently.

2. The semiconductor switch of claim 1, further comprising a second PNPN SCR structure comprising parallel and adjacent stripe-shaped n-type and p-type planar regions formed in the top surface of said substrate such that, when the top surface of said substrate is viewed from above in a plan view, said second PNPN SCR structure's parallel and adjacent stripe-shaped n-type and p-type planar regions are oriented such that they are extended parallel to said first axis and arranged adjacent to said MOSFET on the opposite side of said MOSFET from said first PNPN SCR structure, said MOSFET and said first and second PNPN SCR structures arranged such that said semiconductor switch is symmetrical.

3. The semiconductor switch of claim 1, wherein said MOSFET is arranged such that, when on, its channel resistance serves as a ballast resistor which limits the current conducted between said external node and said anode.

4. The semiconductor switch of claim 1, wherein said parallel and adjacent stripe-shaped source, gate and drain planar regions of said MOSFET are interconnected as needed to provide multiple functions, at least one source, drain and gate region arranged to form a MOSFET which, when on, serves as a shunt resistor between said external node and said electrical contact which provides said gate connection.

5. A semiconductor switch, comprising:
   a substrate having top and bottom surfaces;
   a first p-type planar region formed in the top surface of said substrate;
   an first n-type planar region formed laterally adjacent to said first p-type planar region in the top surface of said substrate;
   a second p-type planar region formed laterally adjacent to said first n-type planar region on said substrate, said first and second p-type planar regions and said first n-type planar region arranged to form a PNP transistor;
   a second n-type planar region formed laterally adjacent to said second p-type planar region on said substrate, said first and second n-type planar regions and said second p-type planar region arranged to form a NPN transistor, said PNP and NPN transistors arranged to form a first PNPN silicon-controlled rectifier (SCR) structure;
   an electrical contact on said first p-type planar region to provide an anode for said SCR structure;
   an electrical contact on said first n-type planar region to provide a gate for said SCR structure;
   an electrical contact on said second n-type planar region to provide a cathode for said SCR structure;
   an external node; and
   a MOSFET formed in the top surface of said substrate and arranged to conduct a current between said external node and said anode when on and to inhibit the current conducted between said external node and said anode and thereby turn off said semiconductor switch when off, said SCR structure arranged to conduct a current between said anode and said cathode when a voltage lower than a threshold voltage is applied to said electrical contact which provides said gate, and to maintain said current conduction via regenerative feedback when the voltage applied to said electrical contact which provides said gate rises above said threshold voltage as long as said current conducted between said anode and cathode is greater than a threshold current, wherein said first n-type, second p-type and second n-type planar regions are parallel, stripe-shaped planar regions which form said first PNPN SCR structure with said first p-type planar region, and said MOSFET is a planar structure comprising parallel and adjacent stripe-shaped source, gate and drain planar regions with the gate regions spaced apart from each other formed in the top surface of said substrate adjacent to said first PNPN SCR structure, such that, when the top surface of said substrate is viewed from above in a plan view, said first PNPN SCR structure's parallel stripe-shaped planar regions are oriented such that they are extended parallel to a first axis and said MOSFET is oriented such that said MOSFET's parallel and adjacent stripe-shaped source, gate and drain planar regions are extended perpendicular to said first axis, such that said first PNPN SCR structure and said MOSFET can be sized independently.

6. The semiconductor switch of claim 5, wherein said MOSFET is arranged as a symmetrical device and further comprising a second PNPN SCR structure comprising parallel and adjacent stripe-shaped n-type and p-type planar regions formed in the top surface of said substrate such that, when the top surface of said substrate is viewed from above in a plan view, said second PNPN SCR structure's parallel and adjacent stripe-shaped n-type and p-type planar regions are oriented such that they are extended parallel to said first axis, said second PNPN SCR structure located adjacent to said MOSFET on the opposite side of said MOSFET from said first PNPN SCR structure, such that said semiconductor switch is symmetrical.

7. The semiconductor switch of claim 5, wherein said MOSFET is a PMOS device, comprising:

a plurality of pairs of stripe-shaped p-type regions oriented perpendicularly to said first axis when the top surface of said substrate is viewed from above in a plan view, one stripe-shaped p-type region of each pair being a drain region and the other stripe-shaped p-type region of each pair being a source region, the stripe-shaped p-type regions of each pair located on opposite sides of a respective one of said stripe-shaped gate regions, wherein at least one source, drain and gate region are arranged to form said MOSFET which conducts a current between said external node and said anode when on and inhibits the current conducted between said external node and said anode connection and thereby turns off said semiconductor switch when off, the drain regions and source regions of said MOSFET comprising said anode and said external node, respectively.

8. The semiconductor switch of claim 7, wherein at least one source, drain and gate region are arranged to form a second MOSFET which, when on, serves as a shunt resistor between said external node and said electrical contact which provides said gate and thereby provides a path for leakage current that might otherwise falsely trigger said first PNPN SCR structure to conduct.

9. The semiconductor switch of claim 7, wherein each of said anodes further comprises a first contiguous stripe-shaped p-type region oriented parallel to said first axis when the top surface of said substrate is viewed from above in a plan view, such that said anodes provide a larger interface area with said first n-type planar region than do said external nodes.

10. The semiconductor switch of claim 9, wherein said first n-type planar region comprises a n+ portion immediately adjacent to said MOSFET, said external nodes arranged to terminate at said n+ portion immediately adjacent to said MOSFET so as to depress the beta value of transistors formed by said external nodes, said first n-type stripe-shaped planar region, and said stripe-shaped p-type regions.

11. The semiconductor switch of claim 9, wherein said MOSFET is arranged as a symmetrical device and further comprising a second PNPN SCR structure comprising parallel and adjacent stripe-shaped n-type and p-type planar regions formed in the top surface of said substrate and oriented such that they are extended parallel to said first axis when the top surface of said substrate is viewed from above in a plan view, said second PNPN SCR structure located adjacent to said MOSFET on the opposite side of said MOSFET from said first PNPN SCR structure, such that said semiconductor switch is symmetrical, wherein each of said anodes further comprises a second contiguous stripe-shaped p-type region oriented parallel to said first axis when the top surface of said substrate is viewed from above in a plan view, each of said anodes being I-shaped with said first and second contiguous stripe-shaped p-type regions being at opposite ends of said anode's p-type planar region oriented perpendicularly to said first axis, such that said first and second contiguous stripe-shaped p-type regions serve as an anode for said first PNPN SCR structure and said second PNPN SCR structure, respectively.

12. The semiconductor switch of claim 5, wherein said MOSFET is arranged such that, when on, its channel resistance serves as a ballast resistor which limits the current conducted between said external node and said anode.

13. The semiconductor switch of claim 5, further comprising a third p-type region formed laterally adjacent to and electrically connected to said second n-type planar region, said third p-type region and said second p-type planar region having a resistance between them which serves as a shunt resistor between said cathode and the base of said NPN transistor.

14. The semiconductor switch of claim 5, wherein said second n-type planar region serves as an emitter for said NPN transistor and has an associated resistance which serves as a ballast resistor for said emitter of said NPN transistor.

15. The semiconductor switch of claim 5, wherein:
said first p-type planar region is a p+ region;
said first n-type planar region is an n-well (NW) region;
said second p-type planar region is a p-well (PW) region; and
said second n-type region is a n+ region.

16. The semiconductor switch of claim 5, further comprising a p-well (PW) region which encloses said second p-type planar region and said second n-type region such that a blocking junction is formed between said PW region and said first n-type planar region.

17. The semiconductor switch of claim 5, further comprising a n-type buried layer (NBL) located such that it electrically isolates said semiconductor switch from said substrate.

18. The semiconductor switch of claim 5, further comprising:
- a third p-type planar region formed laterally adjacent to and electrically connected to said second n-type planar region; and
- a third n-type planar region formed laterally adjacent to said third p-type planar region and electrically connected to said first n-type planar region.

19. The semiconductor switch of claim 18, wherein said third p-type planar region and said third n-type planar region form a diode which provides a reverse conduction path through said semiconductor switch which acts to discharge high stress EOS/ESD current conducted between said cathode and said anode of said semiconductor switch.

* * * * *